United States Patent
Senfluk et al.

(10) Patent No.: US 10,658,980 B2
(45) Date of Patent: May 19, 2020

(54) MODULATING INPUT DEVICE HAVING A FULL WAVE RECTIFIER

(71) Applicant: Honeywell International Inc., Morris Plains, NJ (US)

(72) Inventors: Petr Senfluk, Brno (CZ); Petr Gross, Omice (CZ)

(73) Assignee: Honeywell International Inc., Morris Plains, NJ (US)

( * ) Notice: Subject to any disclaimer, the term of this patent is extended or adjusted under 35 U.S.C. 154(b) by 84 days.

(21) Appl. No.: 16/108,972

(22) Filed: Aug. 22, 2018

(65) Prior Publication Data

US 2020/0067458 A1 Feb. 27, 2020

(51) Int. Cl.
| | |
|---|---|
| H03F 1/02 | (2006.01) |
| H03F 3/45 | (2006.01) |
| G01R 19/22 | (2006.01) |
| H03B 19/14 | (2006.01) |
| H03F 3/72 | (2006.01) |

(52) U.S. Cl.
CPC ........... *H03F 1/0238* (2013.01); *G01R 19/22* (2013.01); *H03B 19/14* (2013.01); *H03F 3/45959* (2013.01); *H03F 3/72* (2013.01)

(58) Field of Classification Search
CPC ...... H03F 1/0238; H03F 3/45959; H03F 3/72; H03B 19/14; G01R 19/22
See application file for complete search history.

(56) References Cited

U.S. PATENT DOCUMENTS

| | | | |
|---|---|---|---|
| 4,812,945 A | 3/1989 | D'Onofrio | |
| 5,867,379 A * | 2/1999 | Maksimovic | ....... H02M 1/4225 323/222 |
| 6,194,885 B1 * | 2/2001 | Oshima | ............... H02M 1/4225 323/285 |
| 7,936,152 B2 * | 5/2011 | Shimizu | .............. H02M 1/4225 323/222 |
| 2004/0213025 A1 | 10/2004 | Elek et al. | |
| 2014/0043875 A1 * | 2/2014 | Hsing | ....................... G05F 1/56 363/77 |
| 2014/0062441 A1 | 3/2014 | Butler | |

* cited by examiner

*Primary Examiner* — Emily P Pham
(74) *Attorney, Agent, or Firm* — Seager, Tufte & Wickhem LLP

(57) ABSTRACT

A circuit that receives AC power for rectification and analog DC control signals for processing. Two voltages may be noted. A first voltage may be between a supply ground and an internal device ground of a rectifier. A second voltage may be between a terminal of an input control signal source and the internal device ground. To get a control signal value, one may need a differential of those two voltages that can be accomplished with an operational amplifier configured as differential amplifier. A range of an input control signal may be from zero to a particular magnitude of voltage. A reasonably priced operational amplifier might not have an ability provide an output to zero. However, a linearized transistor output stage, having an output that can go to zero, may be connected to an output of the operational amplifier so as to effectively provide an output that goes to zero.

20 Claims, 2 Drawing Sheets

MODULATING INPUT DEVICE HAVING A FULL WAVE RECTIFIER

BACKGROUND

The present disclosure pertains to signal conditioning circuitry.

SUMMARY

The disclosure reveals a circuit that receives AC power for rectification and analog DC control signals for processing. Two voltages may be noted. A first voltage may be between a supply ground and an internal device ground of a rectifier. A second voltage may be between a terminal of an input control signal source and the internal device ground. To get a control signal value, one may need a differential of those two voltages that can be accomplished with an operational amplifier configured as differential amplifier. A range of an input control signal may be from zero to a particular magnitude of voltage. A reasonably priced operational amplifier might not have an ability provide an output to zero. However, a linearized transistor output stage, having an output that can go to zero, may be connected to an output of the operational amplifier so as to effectively provide an output that goes to zero.

DESCRIPTION

Figure 1:
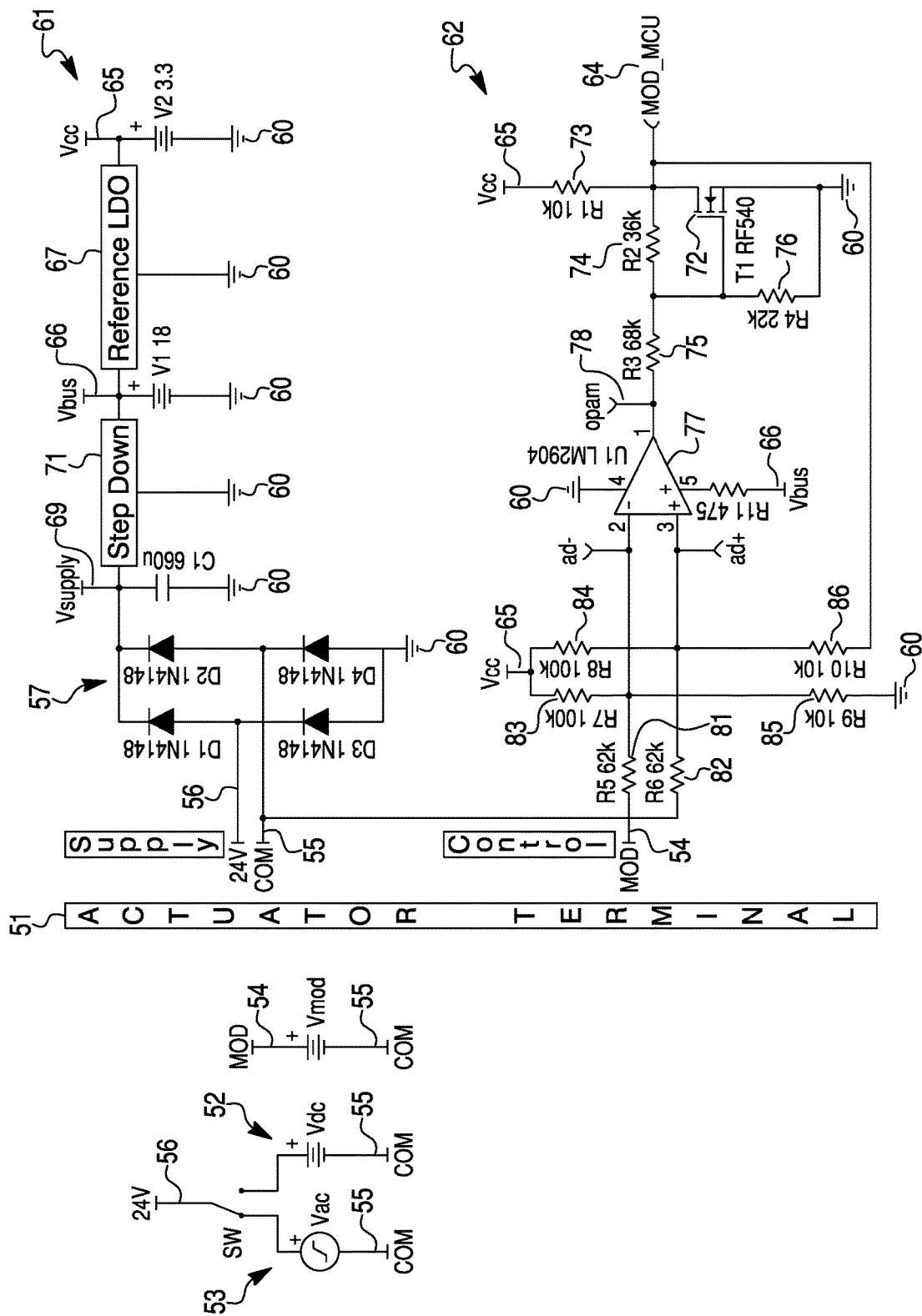
FIG. 1 is a diagram of a circuit of the present mechanism.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Aspects of the system or approach may be described in terms of symbols in the drawing. Symbols may have virtually any shape (e.g., a block) and may designate hardware, objects, components, activities, states, steps, procedures, and other items.

The present circuit may provide a modulating input for an actuator in combination with a full wave rectifier. On one side, the full wave rectifier may bring an advantage of a high power factor (e.g., 1.0) of a device powered from an AC supply. On the other side, there is not necessarily a common ground, which may be used for connecting analog DC control signals. Thus, in this case, a half-wave rectifier may be used with a lower than 1.0 power factor (e.g., 0.707). The present circuit may provide a combination having a full wave rectifier output with analog DC control signals.

A volt-ampere (VA) rating, as product parameter, may be critical for some customers. With a higher power factor, one may have lower a VA rating for the same real power in watts. For a lower VA rating, a customer may use lower rated and cheaper transformers as a supply device, which may be beneficial for the customer.

In FIG. 1, items on the right side of an actuator terminal 51 are inside of an actuator. There may be a supply circuit 61 and a control circuit 62. On the left side of actuator terminal 51 is an actuator supply voltage (24 Vdc) 52 or (24 Vac) 53 and DC modulating control signal 54 (23 on FIG. 2).

Modulating signal (MOD) 54 may be between 0V and 10V and be applied against common supply wire/terminal (COM) 55. Based on a value of the mod signal 54 may be an actuator proportionally drive output shaft. For example, 0V means fully closed, 10V means fully open and 5V means 50 percent open. The circuit may process modulating signal 55 on an input side of actuator circuit 61 and 62 before full wave rectifier 57 and transform it to signal measurable by microcontroller from (MOD_MCU) 64 behind rectifier 57 against internal device ground 60. With 10V on MOD terminal 54, MCU_MOD 64 may be almost 1.65V. This may be in a reference signal for AD converters. A reference voltage may be derived inside a microcontroller from supply voltage (Vcc) 65 as 3.3V*0.5. Reference 3.3V voltage (Vcc) 65 may be derived from bus supply voltage (Vbus) 66 by reference low-dropout (LDO) regulator 67. Bus supply voltage 66 may be about 18V and also power-up operational amplifier 68. Bus supply voltage 66 may be derived from rectified supply voltage (Vsupply) 69 by step down switching convertor 71.

A linearization circuit may incorporate transistor 72, resistor 73, resistor 74, resistor 75 and resistor 76 (T1, R1, R2, R3 and R4, respectively). A common inexpensive operational amplifier, such as an operational amplifier (op amp) 77, might not reach zero voltage at output 78. That is why inverter transistor 72 (T1) may be used. Without resistor network (resistors 73-76) around transistor 72 (T1), transistor 72 (T1) may respond to small voltage changes around Vgsth on the gate by big voltage changes on the drain. Operational amplifier 77 (U1) would not necessarily be able to regulate this output drain voltage.

With resistor network (resistors 73-76) around transistor 72 (T1), op amp 77 (U1) may need to deliver about 8V for almost 0V on MOD_MCU 64 and about 4V for 1.65V on MOD_MCU 64. This may be a much better range for regulation. Therefore, op amp 77 (U1) may be powered from Vbus 66. A minimal power supply voltage for op amp 77 (U1) may be about 10V. Op amp 77 (U1) with resistors 81, 82, 83, 84, 85 and 86 (i.e., R5, R6, R7, R8, R9 and R10, respectively) on its input side may work as a differential amplifier with gain about 1.65/10 (10V on actuator modulating (MOD) input 54 that gives about 1.65V on microcontroller AD convertor (MOD_MCU) 64.

Capacitor (C1) (660 uF) on Vsupply is not necessarily a critical component. Its value may depend on power requirements of the actuator. Examples of ohm values for resistors may be where resistor 73=10k, resistor 74=36k, resistor 75=68k, resistor 76=22k, resistor 81=62k, resistor 82=62k, resistor 83=100k, resistor 84=100k, resistor 85=10k, and resistor 86=10k. Other ohm values may be used for the resistors.

Figure 2:
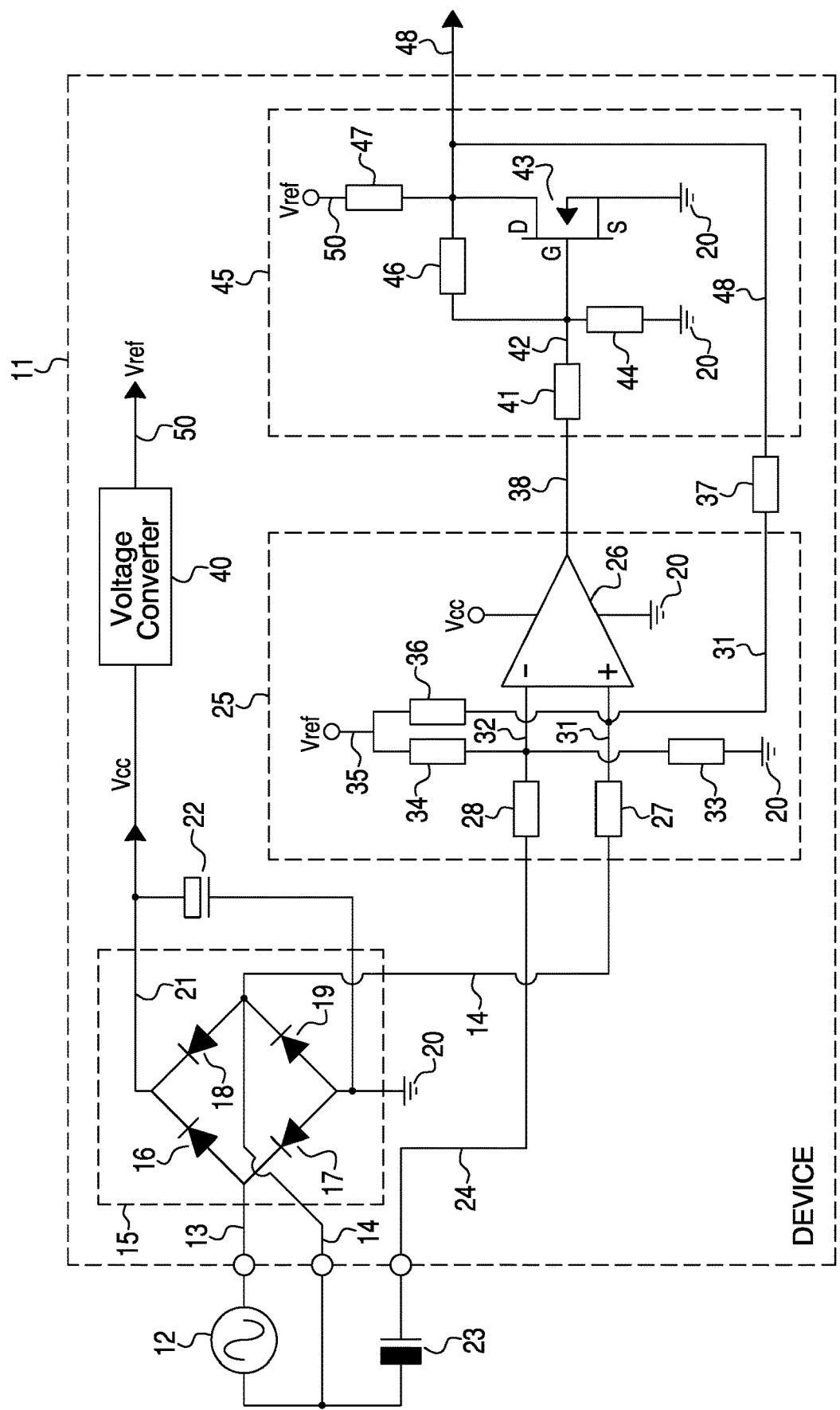
FIG. 2 is an alternative circuit of the present mechanism.

FIG. 2 is a diagram of an alternative circuit for the present mechanism. A basic principle may be in measuring two voltages. A first voltage may be between a supply ground 14 and an internal device ground 20 of a rectifier bridge 15. A second voltage may be between a terminal 24 of an input control signal source 23 and internal device ground 20. To get a value of the control signal, one may need a differential of those two voltages at the same time. To avoid complications caused from tuning two independent ADCs, there may be an operational amplifier 26 used as a differential amplifier. A standard range of the control signal may be from zero to ten volts. An operational amplifier with an ability to go on with an output to zero may be typically more expensive than standard amplifiers. Therefore, a linearized transistor output stage 45, for having an output that can go to zero, may be connected between operational amplifier 26 and an output 48 to an ADC. Devices with analog input control signals may be referenced against a common power supply ground 14.

FIG. 2 is a diagram of a circuit 11 designed for modulating an input for an actuator in combination with a full-wave rectifier. An electrical source 12 may provide a 24 VAC supply along conducting lines 13 and 14 to a rectifier 15. Line 13 may be connected to an anode of a diode 16 and a cathode of a diode 17. Line 14 may be connected to an anode of a diode 18 and a cathode of diode 19. The anodes of diodes 17 and 19 may be connected to an internal device ground 20. The cathodes of diodes 16 and 18 may be connected to a conducting line 21. A voltage (Vcc) may come from line 21. A voltage conversion circuit 40 may have Vcc on line 21 as an input and have a reference voltage (Vref) as an output on a line 50.

An output across line 21 and ground 20 of rectifier 15 may be a full wave rectification of the AC input from source 12. A capacitor 22 may be connected across line 21 and ground 20. Item 23 may be connected across line 14 and a line 24. Item 23 may provide a DC control input signal on line 24. Line 14 may be regarded as a supply ground (com).

Two voltages of interest may be a voltage V1 measurable between a supply ground of line 14 and internal device ground 20, and a voltage V2 measurable between DC control input signal of line 24 and internal device ground 20.

Voltages V1 and V2 may be provided to an operational amplifier 26 that is configured with resistors having appropriate values to result in a differential amplifier 26. Line 14, for Carrying voltage V1, may be connected via a resistor 27 and a line 31 to a non-inverting input of operational amplifier 26. Line 24, for carrying voltage V2, may be connected via a resistor 28 and a line 32 to an inverting input of operational amplifier 26.

Line 32 may be connected via a resistor 33 to ground 20. Line 32 may also be connected via a resistor 34 to a voltage reference (Vref) terminal line 50. Line 31 may be connected via a resistor 36 to voltage reference terminal 50. An output line 38 from amplifier 26 may go to an input of a linearized output stage 45. The input may be at one end of a resistor 41. The other end of resistor 41 may be connected via a line 42 to a gate of an N-channel FET 43. Line 42 may be connected to ground 20 via a resistor 44. Line 42 may also be connected via a resistor 46 to an output line 48. Output line 48 may be connected to a drain of FET 43. Also line 48 may be connected to a voltage terminal line (Vref) 50 via a resistor 47. A source of FET 43 may be connected to ground 20. Output line 48 may be connected via a feedback resistor 37 to line 31.

Examples of resistor values may be 62k ohms for resistor 27, 62k ohms for resistor 28, 10k for resistor 33, 100k for resistor 34, 100k for resistor 36, 10k for resistor 37, 68k for resistor 41, 22k for resistor 44, 36k for resistor 46, and 10k for resistor 47. Capacitor 22 may be 660 microfarads, depending on the load presented by the actuator circuits 25 and 45.

To recap, an actuator circuit may incorporate a rectifier having a supply ground input and a supply voltage input, and a device ground output and a device voltage output; a control signal source output; an operational amplifier having a first input for a first voltage between the supply ground input and the device ground output, and a second input for a second voltage between the control signal source output and the device ground output; and a linearization circuit having an input connected to an output of the operational amplifier and having an output that can go to zero.

The supply voltage input may be connected to an anode of a first diode and a cathode of a second diode. The supply ground input may be connected to an anode of a third diode and a cathode of a fourth diode. The device voltage output may be connected to cathodes of the first and third diodes. The device ground output may be connected to anodes of the second and fourth diodes. The first input of the operational amplifier may be an inverting input. The second input of the operational amplifier may be a non-inverting input connected to the supply ground input of the rectifier.

The linearization circuit may incorporate a transistor having the input as a gate connected to the output of the operational amplifier, a source connected to the device ground output of the rectifier, and having an output as a drain connected to the first input and the output of the operational amplifier.

The control signal source output, as a modulating voltage for controlling an actuator and a corresponding hub, may be connected across the non-inverting input of the operational amplifier and the supply ground input of the rectifier.

The output of the linearization circuit may provide a signal down to zero for controlling the actuator and the corresponding hub.

A system for conditioning a control signal for an actuator, may incorporate a rectifier having first and second terminals for connection to a supply voltage and a first ground, respectively, and having third and fourth terminals for supplying a device voltage and a second ground, respectively; a control signal source; a differential amplifier having a first input for a first voltage between the first ground and the second ground, a second input for a second voltage between an output of the control signal source and the second ground, and an output for providing differential voltage of the first and second voltages; and a linearization transistor circuit having an input connected to the output of the differential amplifier, and having an output for providing a signal that can go to zero.

The first terminal of the rectifier may be connected to an anode of a first diode and to a cathode of a second diode. The second terminal of the rectifier may be connected to an anode of a third diode and to a cathode of a fourth diode. The third terminal may be connected to the cathode of the first diode and to the cathode of the third diode. The fourth terminal may be connected to an anode of the second diode and to an anode of the fourth diode.

The control signal source may provide a modulating DC voltage.

The linearization transistor circuit may incorporate a field effect transistor having a gate connected to the output of the differential amplifier, a source connected to the second ground, and a drain connected to the output of the linearization transistor circuit.

The differential amplifier may be an operational amplifier configured as a differential amplifier.

The linearization transistor circuit may be configured to provide a go to zero output from the operational amplifier as needed.

The device voltage may be regulated or processed with one or more items selected from a group consisting of a capacitor, step-down voltage circuit, and a low-dropout regulator.

An approach for processing a control signal for an actuator, may incorporate rectifying an AC voltage from a first terminal and a second terminal into a DC voltage on a third terminal and a fourth terminal, generating a modulating DC control signal on a fifth terminal relative to the second terminal of the AC voltage, connecting the fifth terminal to an inverting input of an operational amplifier, connecting the second terminal to a non-inverting input of the operational amplifier, converting the DC voltage from the third terminal and the fourth terminal to a reference voltage on a sixth terminal relative to the fourth terminal, and connecting an output of the operational amplifier to an input of a linearized transistor output stage.

The operational amplifier may function as a differential amplifier of the inverting and non-inverting inputs.

The third terminal and fourth terminal may be for connection to a voltage supply terminal and a ground terminal, respectively, of the operational amplifier.

The sixth terminal and the fourth terminal may be connected to a voltage supply terminal and a ground terminal, respectively, of the linearized transistor output stage.

A voltage from the fifth terminal and the fourth terminal via resistors may be presented to the inverting input. A voltage from the second terminal and the sixth terminal via resistors may be presented to the non-inverting input.

An output of the linearized transistor stage may be connected to the non-inverting input of the operational amplifier.

The linearization transistor stage may function to provide a control signal that can go to zero.

The output of the linearized transistor stage may be for connection to an actuator.

Any publication or patent document noted herein is hereby incorporated by reference to the same extent as if each publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. An actuator circuit comprising:
   a rectifier having a supply ground input and a supply voltage input and a device ground output and a device voltage output;
   a control signal source output;
   an operational amplifier having a first input for a first voltage between the supply ground input and the device ground output, and a second input for a second voltage between the control signal source output and the device ground output; and
   a linearization circuit having an input connected to an output of the operational amplifier and having an output that can go to zero.

2. The actuator circuit of claim 1, wherein:
   the supply voltage input is connected to an anode of a first diode and a cathode of a second diode;
   the supply ground input is connected to an anode of a third diode and a cathode of a fourth diode;
   the device voltage output is connected to cathodes of the first and third diodes;
   the device ground output is connected to anodes of the second and fourth diodes;
   the first input of the operational amplifier is an inverting input; and
   the second input of the operational amplifier is a non-inverting input connected to the supply ground input of the rectifier.

3. The actuator circuit of claim 2, wherein the linearization circuit comprises a transistor having an input as a gate connected to the output of the operational amplifier, a source connected to the device ground output of the rectifier, and having an output as a drain connected to the first input and the output of the operational amplifier.

4. The actuator circuit of claim 3, wherein the control signal source output, as a modulating voltage for controlling an actuator and a corresponding hub, is connected across the non-inverting input of the operational amplifier and the supply ground input of the rectifier.

5. The actuator circuit of claim 4, wherein the output of the linearization circuit can provide a signal down to zero for controlling the actuator and the corresponding hub.

6. A system for conditioning a control signal for an actuator, comprising:
   a rectifier having first and second terminals for connection to a supply voltage and a first ground, respectively, and having third and fourth terminals for supplying a device voltage and a second ground, respectively;
   a control signal source;
   a differential amplifier having a first input for a first voltage between the first ground and the second ground, a second input for a second voltage between an output of the control signal source and the second ground, and an output for providing differential voltage of the first and second voltages; and
   a linearization transistor circuit having an input connected to the output of the differential amplifier, and having an output for providing a signal that can go to zero.

7. The system for conditioning a control signal for an actuator of claim 6, wherein:
   the first terminal of the rectifier is connected to an anode of a first diode and to a cathode of a second diode;
   the second terminal of the rectifier is connected to an anode of a third diode and to a cathode of a fourth diode;
   the third terminal is connected to the cathode of the first diode and to the cathode of the third diode; and
   the fourth terminal is connected to an anode of the second diode and to an anode of the fourth diode.

8. The system for conditioning a control signal for an actuator of claim 6, wherein the control signal source provides a modulating DC voltage.

9. The system for conditioning a control signal for an actuator of claim 6, wherein the linearization transistor circuit comprises a field effect transistor having a gate connected to the output of the differential amplifier, a source connected to the second ground, and a drain connected to the output of the linearization transistor circuit.

10. The system for conditioning a control signal for an actuator of claim 6, wherein the differential amplifier is an operational amplifier configured as a differential amplifier.

11. The system for conditioning a control signal for an actuator of claim 10, wherein the linearization transistor circuit is configured to provide a go to zero output from the operational amplifier as needed.

12. The system for conditioning a control signal for an actuator of claim 6, wherein the device voltage is regulated or processed with one or more items selected from a group consisting of a capacitor, step-down voltage circuit, and a low-dropout regulator.

13. A method for processing a control signal for an actuator, comprising:

rectifying an AC voltage from a first terminal and a second terminal into a DC voltage on a third terminal and a fourth terminal;

generating a modulating DC control signal on a fifth terminal relative to the second terminal of the AC voltage;

connecting the fifth terminal to an inverting input of an operational amplifier;

connecting the second terminal to a non-inverting input of the operational amplifier;

converting the DC voltage from the third terminal and the fourth terminal to a reference voltage on a sixth terminal relative to the fourth terminal; and connecting an output of the operational amplifier to an input of a linearized transistor output stage.

14. The method for processing a control signal for an actuator of claim 13, wherein the operational amplifier functions as a differential amplifier of the inverting and non-inverting inputs.

15. The method for processing a control signal for an actuator of claim 13, wherein the third terminal and fourth terminal are for connection to a voltage supply terminal and a ground terminal, respectively, of the operational amplifier.

16. The method for processing a control signal for an actuator of claim 13, wherein the sixth terminal and the fourth terminal are connected to a voltage supply terminal and a ground terminal, respectively, of the linearized transistor output stage.

17. The method for processing a control signal for an actuator of claim 14, wherein:

a voltage from the fifth terminal and the fourth terminal via resistors is presented to the inverting input; and a voltage from the second terminal and the sixth terminal via resistors is presented to the non-inverting input.

18. The method for processing a control signal for an actuator of claim 17, wherein an output of the linearized transistor stage is connected to the non-inverting input of the operational amplifier.

19. The method for processing a control signal for an actuator of claim 18, wherein the linearization transistor stage functions to provide a control signal that can go to zero.

20. The method for processing a control signal for an actuator of claim 18, wherein the output of the linearized transistor stage is for connection to an actuator.

* * * * *